United States Patent

[11] 3,587,052

[72] Inventor Michael H. Metcalf
Beaverton, Oreg.
[21] Appl. No. 770,910
[22] Filed Oct. 28, 1968
[45] Patented June 22, 1971
[73] Assignee Tektronix, Inc.
Beaverton, Oreg.

[54] TRANSISTOR MATRIX
13 Claims, 7 Drawing Figs.

[52] U.S. Cl. .......... 340/166, 307/303
[51] Int. Cl. .......... H04g 3/00
[50] Field of Search .......... 340/166; 307/303, 248, 249, 250; 235/185, 193, 156, 160, 168

[56] References Cited
UNITED STATES PATENTS
3,483,555 12/1969 Birard .......... 340/166 X

*Primary Examiner*—Ralph D. Blakeslee
*Attorney*—Buckhorn, Blore, Klarquist and Sparkman

ABSTRACT: In a matrix of transistors, base and emitter elements are interconnected in first and second groups wherein each transistor is identified by a unique combination of input connections with respect to the first and second groups. Transistors, the combined input values of which add to the same sum, have common collector output means for providing an adding function. In an integrated circuit construction, the common collector output means comprise adjoining isolation regions, wherein several transistors may be disposed along each isolation region. Means interconnecting transistor emitters in first groups comprise conductors connecting the emitters of no more than one transistor in each isolation region. Dual base terminals permit conductors, which comprise the means to interconnect the transistor base terminals in second groups, to extend in between first group conductors, and from a transistor in one isolation region to a transistor in another isolation region, avoiding crossunders and the like.

MICHAEL H. METCALF
*INVENTOR*

*BY*

*BUCKHORN, BLORE, KLARQUIST & SPARKMAN*
*ATTORNEYS*

MICHAEL H. METCALF
*INVENTOR*

*BY*

*BUCKHORN, BLORE, KLARQUIST & SPARKMAN*
*ATTORNEYS*

MICHAEL H. METCALF
*INVENTOR*
*BY*
*BUCKHORN, BLORE, KLARQUIST & SPARKMAN*
*ATTORNEYS*

TRANSISTOR MATRIX

BACKGROUND OF THE INVENTION

Small scale logical circuits are frequently required for providing digital output, for example, in identification of display information in a test instrument. In a particular instance, an indication is desired of beta per division in a transistor curve tracer apparatus wherein transistor beta is a function of other instrument settings. The digital value is a function of various exponents which must be added. Conventional logical circuitry for accomplishing this logical function can be quite complicated, involving a large number of elements and occupying appreciable space even when integrated circuit devices are employed.

SUMMARY OF THE INVENTION

According to the present invention, a transistor adding matrix comprises a plurality of transistors having their emitter terminals connected in first groups and their base terminals connected in second groups, with each transistor receiving a unique combination of emitter and base input connections. Transistors, the combined inputs of which add to the same sum, have common collector output means. In an integrated circuit embodiment, the common output means are provided by common isolation regions for transistors, the combined inputs of which add to the same sum. Means interconnecting transistor emitter terminals in first groups comprise conductors interconnecting the emitters of no more than one transistor in each region. The transistors are provided with dual base connections, and means interconnecting the transistor base terminals in second groups comprise conductors extending in between the first group of conductors, and from the base of a transistor in one isolation region to the base of a transistor in the next adjoining isolation region. The circuit is implemented thereby in a minimum of space with minimized wiring complications. Although the invention is particularly advantageous as a digital adder, other coded outputs can be supplied by differently interconnecting the transistors of different isolation regions.

It is therefore an object of the present invention to provide an improved transistor matrix for supplying the sum of two numbers with a minimum of transistor structure and wiring.

It is a further object of the present invention to provide an improved transistor matrix in a minimum space in an integrated circuit construction.

It is another object of the present invention to provide an improved integrated circuit adder substantially entirely employing transistor elements.

The subject matter which I regard as my invention is particularly pointed out and distinctly claimed in the concluding portion of this specification. The invention, however, both as to organization and method of operation, together with further advantages and objects thereof may best be understood by reference to the following description taken in connection with the accompanying drawings wherein like reference characters refer to like elements.

DRAWINGS

DETAILED DESCRIPTION

Figures 1, 2:
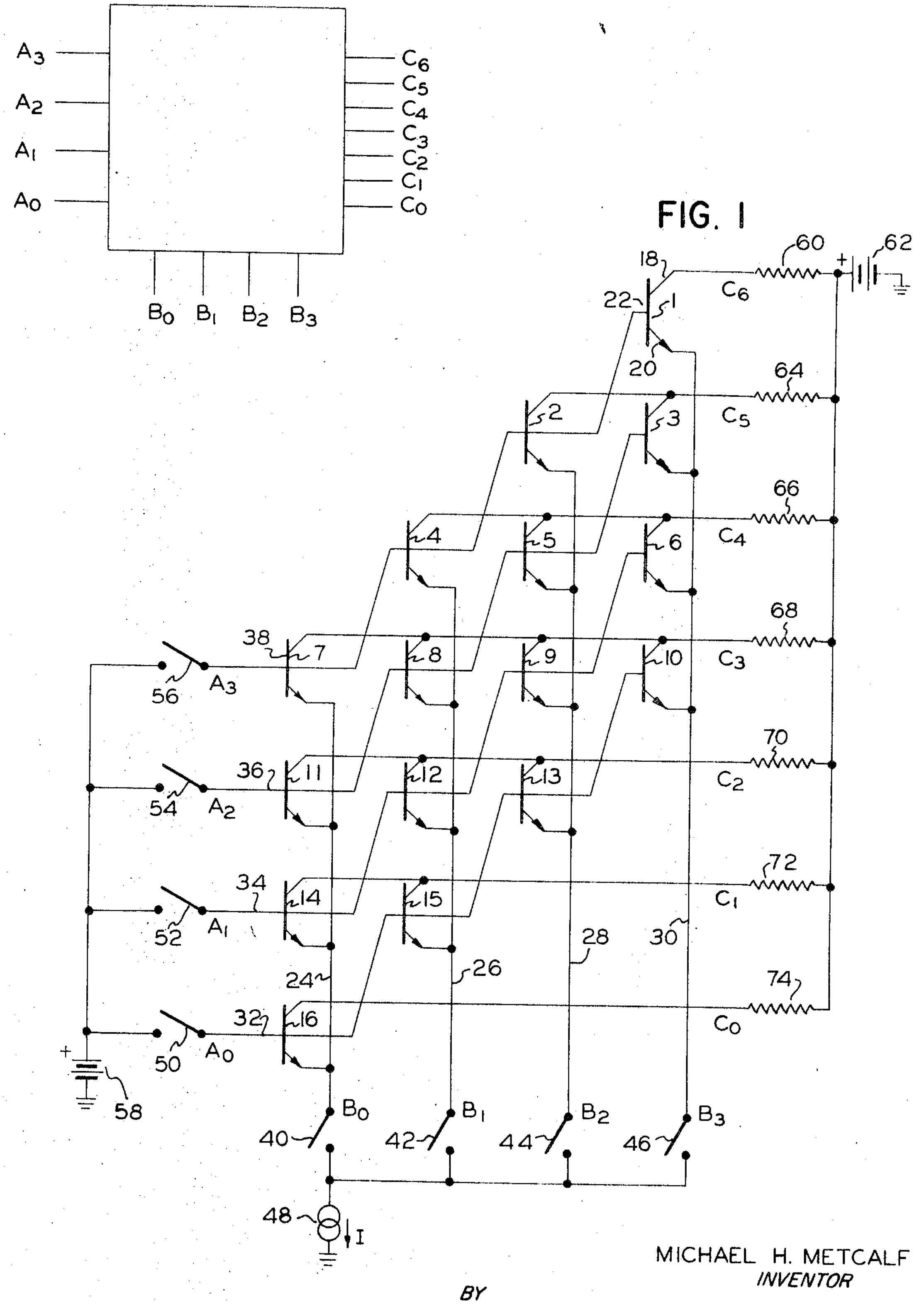
FIG. 1 is a schematic diagram of a transistor adding matrix according to the present invention.
FIG. 2 is a logical block representation of the FIG. 1 circuit.

Referring to FIG. 1, the matrix according to the present invention comprises a plurality of NPN transistors, 1 through 16, each having a collector 18, an emitter 20, and a base 22. These transistors are interconnected in first and second groups such that the emitter terminals are connected in first groups, and the base terminals are connected in second groups. Thus, a conductor 24 interconnects the emitters of transistors 7. 11. 14, and 16 while the conductor 26 connects the emitters of transistors 4, 8, 12, and 15. Similarly, a conductor 28 connects the emitters of transistors 2, 5, 9, and 13 while conductor 30 interconnects the emitters of transistors 1, 3, 6, and 10.

The second group conductors are numbered 32, 34, 36, and 38. Conductor 32 joins the bases of transistors 10, 13, 15, and 16. Likewise conductor 34 interconnects the bases of transistors 6, 9, 12, and 14 while conductor 36 is connected to the bases of transistors 3, 5, 8, and 11. The last conductor, 38, joins the bases of transistors 1, 2, 4, and 7. It will be seen that each transistor is provided with a unique combination of input connections, at its base and emitter elements, with respect to the first and second groups of conductors.

Conductors 24, 26, 28, and 30 of the first group are selectively connected by switches 40, 42, 44, and 46 to a current source 48, the opposite terminal of which is grounded. Only one of the switches is closed at any one time to provide a current on one of the first group of conductors, and thus to the interconnected emitters of the group. The presence of an input by the closure of one of the switches is designated respectively by the terms $B_0$, $B_1$, $B_2$, or $B_3$ corresponding to switches 40, 42, 44 or 46.

Second group conductors 32, 34, 36, and 38 are connected respectively by switches 50, 52, 54, and 56 to the positive terminal of a battery 58, the negative terminal of which is grounded. Only one of these switches is closed at a time, and a base input is provided a corresponding group of transistors when a switch is closed. As one of the switches is closed, the input present is designated by the terms $A_0$, $A_1$, $A_2$, or $A_3$ for switches 50, 52, 54, or 56, respectively.

The collectors of the transistors are also interconnected, here in horizontal transistor rows as illustrated. The collector 18 of transistor 1 is coupled by means of a resistor 60 to the positive terminal of a battery 62, the negative terminal of which is grounded. The collectors of transistors 2 and 3 are coupled through resistor 64 to the positive terminal of battery 62, while the collectors of transistors 4, 5, and 6 are similarly coupled via resistor 66 to such positive terminal. As is further illustrated, the collectors of transistors 7, 8, 9, and 10 are coupled to the same terminal via resistor 68, the collectors of transistors 11, 12, and 13 are coupled to the positive battery terminal via resistor 70; the collectors of transistors 14 and 15 are coupled via resistor 72; and the collector of transistor 16 is coupled to the battery terminal by resistor 74.

The transistor collectors are thus interconnected in groups to provide a coding function. Specifically this coding function provides the sum of the information indicated upon the first and second groups of conductors. Thus a common collector connection joins transistors the inputs of which add to the same number decimally.

The outputs at the collector ends of resistors 60, 64, 66, 68, 70, 72, and 74 are respectively designated $C_6$ through $C_0$. Thus, when an input $A_0$ and $B_0$ are both present through the closures of switches 40 and 50, the collector end of resistor 74 will drop in voltage due to the current, I, passing through resistor 74 and transistor 16. This current will pass through no other transistor, inasmuch as only one switch of each group is closed. The logic performed by the circuit, which is also illustrated as a logic block in FIG. 2, is expressed by the following logic equations:

$$C_0=(A_0 \cdot B_0)$$

$$C_1=(A_1 \cdot B_0)+(A_0 \cdot B_1)$$

$$C_2=(A_1 \cdot B_0)+(A_1 \cdot B_1)+(A_0 \cdot B_2)$$

$$C_3=(A_3 \cdot B)+(A_2 \cdot B_1)+(A_1 \cdot B\ 2)\ A_0 \cdot B_3)$$
$$C_4=(A_3 \cdot B_1)+(A_2 \cdot B_2)+(A_1 \cdot B_3)$$
$$C_5=(A_3 \cdot B_2)+(A_2 \cdot B_3)$$
$$C_6=(A_3 \cdot B_3)$$

In considering the decimal addition, let us further assume, for example, that the $A_1$ input is present, and the $B_2$ input is present. Referring again to FIG. 1, although the base of transistor 14 is positive, no current is provided its emitter. The same holds for transistor 12. However, transistor 9 is both provided a positive base voltage and an emitter current. Therefore, an output is supplied at $C_3$ indicating a correct answer, i.e. 3. It should be noted that the $C_3$ output is indicated by a drop in voltage at the collector end of resistor 68 if any of the transistors 7, 8, 9, or 10 is energized. Thus, a "three" output is produced for the combination of $A_3$ and $B_0$, or the combination of $A_2$ and $B_1$, or the combination of $A_1$ and $B_2$, or for the combination of $A_0$ and $B_3$. This corresponds to the fourth logical equation above indicated for $C_3$.

The logic performed comprises decimal addition in this instance. Although only four digits are added corresponding to inputs $A_0$ through $A_3$ and $B_0$ through $B_3$, it is understood that the circuit is easily expanded to any desired number of digits, for example, in the case of a decimal adder, 10 A and 10 B inputs are received as hereinafter more fully described, and 19 C outputs are produced, indicating zero to nine outputs and zero to eight outputs with carries. In the instance illustrated in FIGS. 1 through 3, the circuit was used in particular to add exponents for the multiplication of numbers. Each number had a magnitude multiplier with only three possible exponents, i.e. $10^0$, $10^{13}$, $10^{16}$, or $10^{19}$. For this purpose this size of the FIG. 1 matrix is ample.

Figures 3, 4, 5:
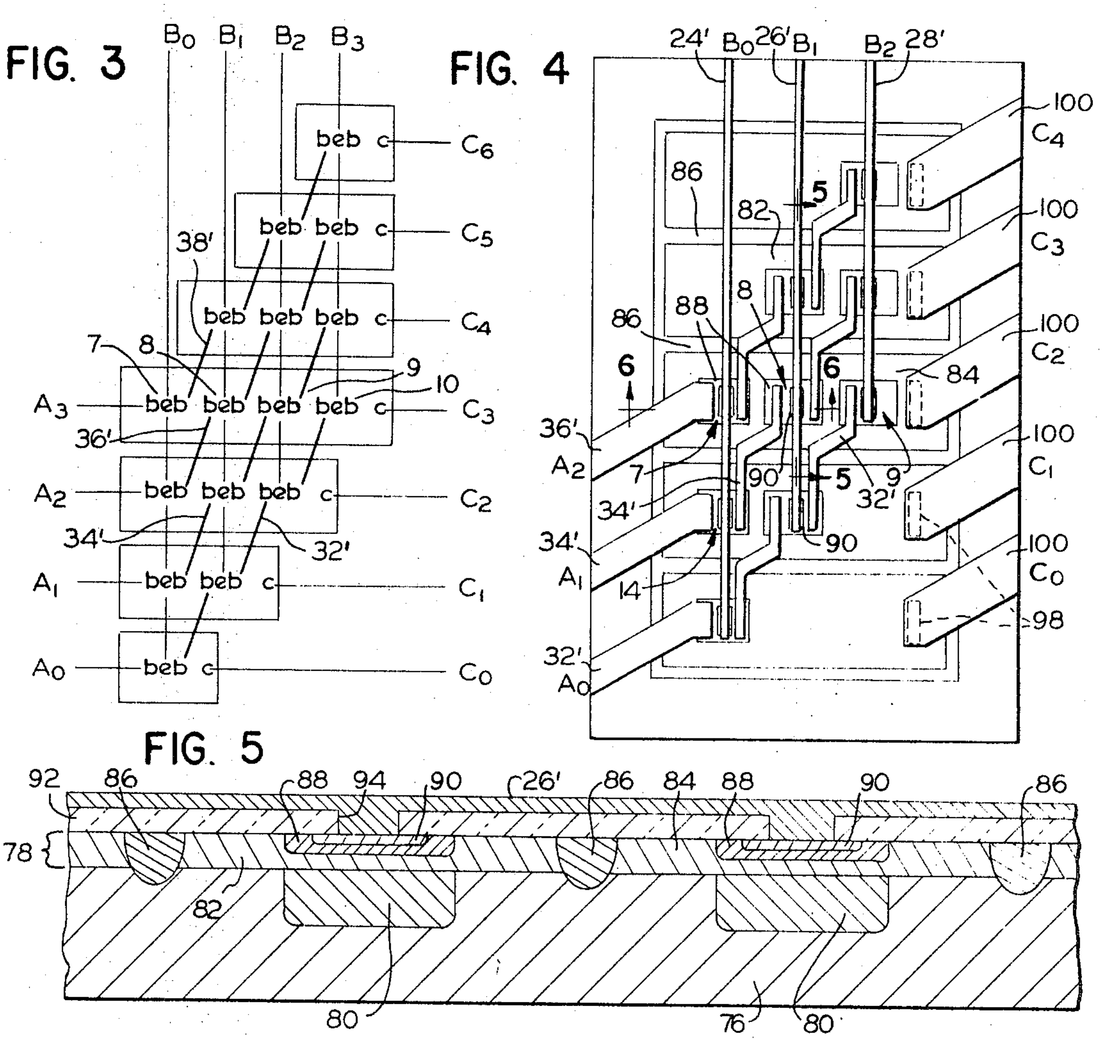
FIG. 3 is a general layout or configuration of an integrated circuit embodiment of the present invention.
FIG. 4 is a top view of an integrated circuit embodiment of the present invention.
FIG. 5 is a cross sectional view taken at 5–5 in FIG. 4.

A suitable integrated circuit configuration layout for the FIG. 1 circuit is illustrated in FIG. 3. This circuit diagrammatically illustrates the position of placement of elements on a monolithic integrated circuit chip. It is noted only transistors are employed within the chip, thereby facilitating a compact construction thereof. The collectors are interconnected in horizontal rows in the same manner as in FIG. 1, these collectors being common to a number of transistors. For example, transistors 7, 8, 9, and 10 share a common collector *c*. Each transistor emitter is labeled with the letter *e* with a *b* on either side thereof indicating identical base connections. This arrangement advantageously implements the circuit of FIG. 1 wherein interbase connections 38′, 36′, 34′, and 32′, for example, need not then cross other conductors. This feature, as well as the employment of common collector regions for a plurality of transistors as mentioned above, facilitates the implementation of the circuit in a greatly compacted integrated circuit structure. The same logic, performed by standard logical circuitry, would employ many times the number of circuit elements, and a great many complicated interconnections.

Figure 6:
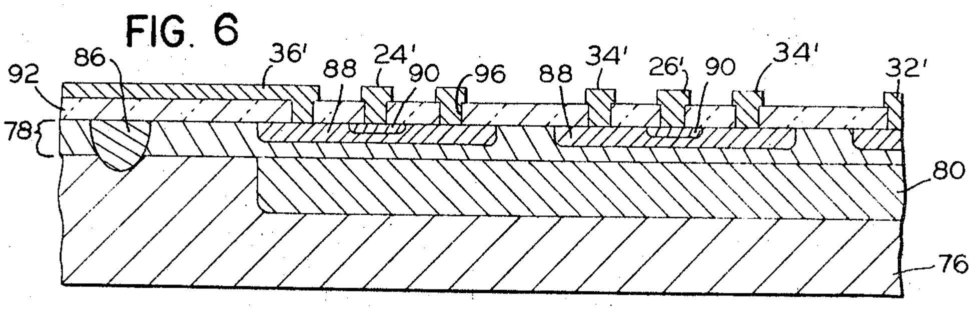
FIG. 6 is a cross section taken at 6–6 in FIG. 4.

FIG. 4 is a top view of an integrated circuit embodiment of the present invention, while FIGS. 5 and 6 are cross sections taken as indicated in FIG. 4. It will be observed that the construction of FIG. 4 includes only nine transistors instead of 16, providing three "A" inputs and three "B" inputs as well as five "C" outputs. However, the construction pattern is the same, employing only transistors within the integrated circuit.

Referring to FIG. 4, the integrated circuit embodiment is provided with a substrate member 76 of semiconductor material. Substrate member 76 is suitably P type silicon having a resistivity of 10 ohm-centimeters. A layer 78 of substantially uniform resistivity formed of N-type semiconductor material having a resistivity of one ohm-centimeter is provided on the upper surface of the substrate member in a suitable manner such as by epitaxial growth, employing a doping impurity of phosphor or other N-type dopant. Beneath the epitaxial layer 78 is a layer 80, divided into strips, of N-type semiconductor material having a lower resistivity than such epitaxial layer. Region 80 is known as a buried layer.

The epitaxial layer 78 provides several collector regions, e.g. regions 82 and 84 as viewed in FIG. 5. These collector regions are separated by an isolation grid 86 of P-type semiconductor material formed by diffusing boron or the like completely through the epitaxial layer 78 and into the substrate member 76. The isolation grid electrically isolates the collector areas from one another.

Base and emitter layers or regions 88 and 90 are provided by diffusing appropriate doping material into the epitaxial layer, to form P-type and N-type regions, respectively, in the usual manner. Base regions are spaced along a collector region to provide a plurality of transistors, such as transistors 7, 8, and 9, along a given collector region. A base region, of course, in each case separates each emitter region from the underlying collector region. The base regions are also substantially juxtaposed above and along the layer 80, with the layer 80 extending centrally of each collector region.

Over the structure formed as described above is disposed a layer of insulating material 92, suitably comprising silicon dioxide. This layer is etched to provide apertures, such as at 94 and 96, to expose a desired semiconductor element thereunder to which connections may be made as schematically illustrated in FIG. 3. Thus an aperture is provided at the location of each emitter region as well as an aperture on either side thereof for connection to the base region. Base connections on each side of the emitter, as mentioned above, avoid crossovers, or crossunders, of circuit conductors.

In addition, regions 98 of N-type material are provided by diffusing appropriate doping into the epitaxial layer at ends of the collector regions, and apertures in layer 92 are formed in juxtaposition therewith. Then conductors 32′, 34′, 36′, 24′, 26′, 28′, and conductors 100 (for the collector regions) are provided for making connection with the various elements through the aforementioned apertures in layer 92. While the structure is illustrated in the drawings as being formed on an individual semiconductor substrate, it is understood that this circuit will frequently be included on a larger substrate or chip along with other connecting circuitry.

It is noted the conductors of the second group, e.g. conductors 32′, 34′, and 36′, are in a sense discontinuous since these conductors make connection with the appropriate transistor base portions on either side of each transistor emitter. However, the base resistance is not such as to interfere with the operation of the circuit when such resistance is taken into account. Therefore, crossunders and the like are not required. A portion of a second group conductor, e.g. conductor 34′, in between a pair of first group conductors 24′ and 26′, connects the base of a transistor 14 in one isolation region with the base of a transistor 8 associated with the next adjacent isolation region, wherein the latter transistor is also interconnected in a different first group.

Figure 7:
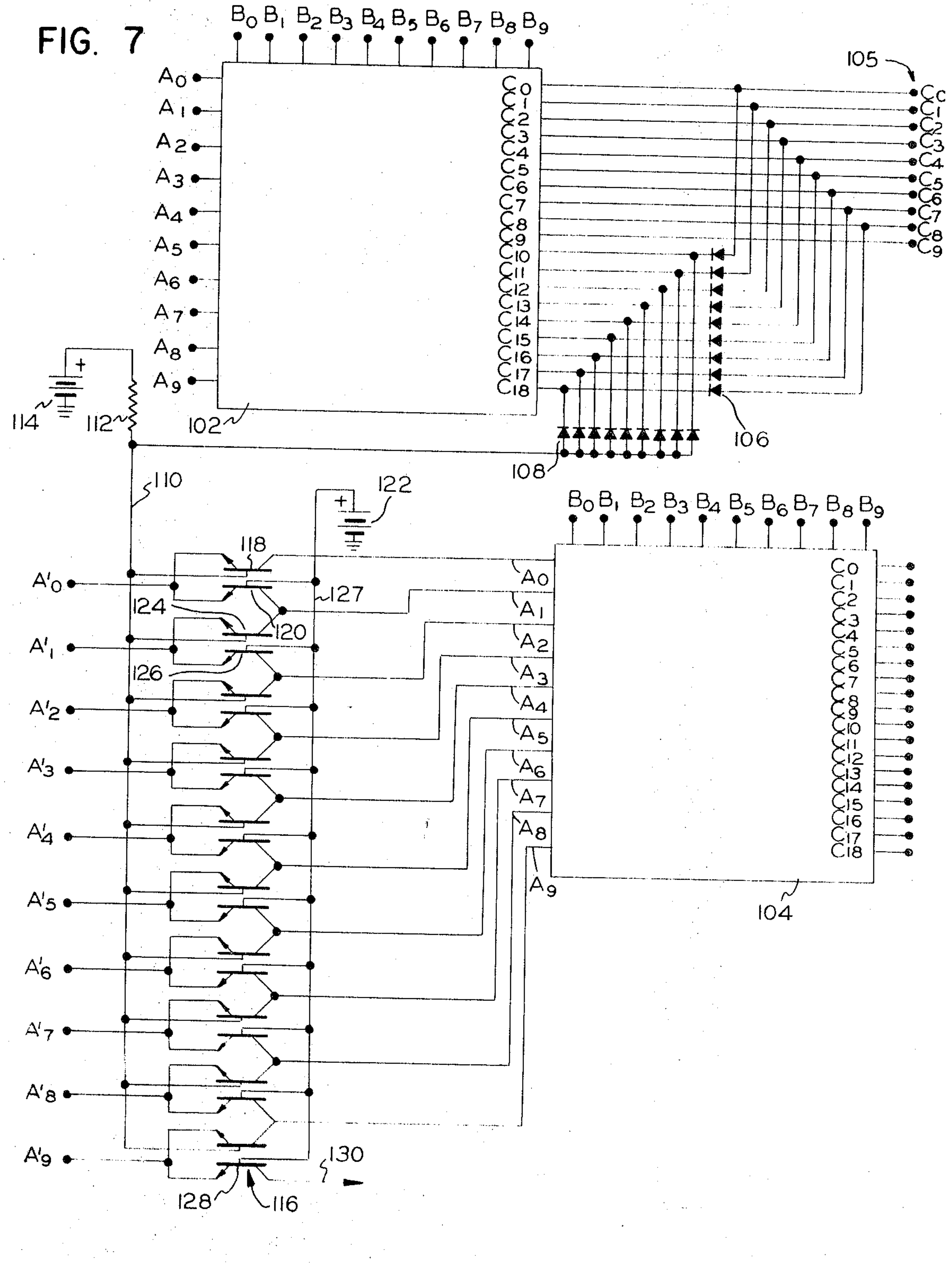
FIG. 7 is a schematic diagram of a decimal adder according to the present invention.

FIG. 7 illustrates a decimal adder according to the present invention. This circuit exemplifies the addition of two decimal digit columns. It is readily appreciated the circuit is expandable to a larger number of digits, as desired.

Referring to FIG. 7, the circuit employs a matrix 102 and another matrix 104 having the same pattern of construction as illustrated in FIGS. 1 through 6 except that each of the matrices 102 and 104 is provided with 10 A inputs, $A_0$ through $A_9$, and 10 B inputs, $B_0$ through $B_9$. Each also provides nineteen outputs $C_0$ through $C_{18}$. The first 10 outputs, $C_0$ through $C_9$ of matrix 102, are connected to corresponding circuit output terminals 105, also designated $C_0$ through $C_9$. The next nine outputs $C_{10}$ through $C_{18}$ are connected via diodes 106 to the aforementioned circuit output terminals. I.E. output $C_{18}$ is connected to $C_8$, output $C_{17}$ is connected to $C_7$, etc. Also, the outputs $C_{10}$ through $C_{18}$ connected via diodes 108 to a bus 110 are coupled via resistor 112 to the positive terminal of battery 114, with the opposite terminal of the battery being grounded. The anode terminals of diodes 106 are connected to circuit output terminals $C_0$ through $C_9$ and the cathodes of diodes 108 are connected to the cathodes of diodes 106.

Bus 110 is connected to the base element of every other transistor in a bank of transistors 116, while a bus 127, connected to the positive terminal of battery 122, is connected to the base terminals of the intervening transistors. The remaining terminal of battery 122 is grounded.

The lowest order A and B decimal inputs to be added are applied directly to the A and B terminals of the matrix 102. Likewise, the next higher order B input is applied via the B terminals of matrix 104, but the next higher order A input is applied via transistor bank 116. This A input is applied at terminals designated $A_0'$ through $A_9'$, respectively connected to the emitters of adjacent transistors as shown. For example, input $A_0'$ is connected to the emitters of first transistors 118 and 120, wherein the collector of transistor 118 is connected to the $A_0$ input of matrix 104 while the collector of transistor 120 is connected to the $A_1$ input of matrix 104. The base of transistor 118 is connected to bus 110, while the base of transistor 120 is connected to bus 127. Also, the $A_1'$ input is applied to both the emitter terminals of transistors 124 and 126, the next pair of transistors in bank 116. The collector of transistor 124 is connected to the $A_1$ input of matrix 104, and the collector of transistor 126 is connected to the $A_2$ input of matrix 104. The base of transistor 124 is connected to bus 110, while the base of transistor 126 is connected to bus 127, and so on. The final transistor in bank 116, i.e. transistor 128, has its emitter connected to the $A_9'$ input, while its collector is connected to lead 130, which is provided as an additional carry indicating signal lead to a next higher order stage.

Considering operation of the circuit of FIG. 7, if an A digit and a B digit are applied via appropriate inputs to matrix 102, and if the resultant addition does not exceed 9, one of the output terminals 105 will be more negative than the others, indicating an output of the appropriate sum value. If the appropriate output is between 10 and 18, one of the outputs $C_0$ through $C_9$ will be energized through one of the diodes 106. For example, if the output is 11, a $C_1$ output will be indicated through the diode. Moreover, bases of transistors in bank 116, for example transistor 118, transistor 124, etc., be pulled down because a diode 108 conducts current from battery 114 through resistor 112, and the voltage drop across resistor 112 will reduce the base voltage on these transistors. Transistor 120 is normally biased so that it does not conduct, while transistor 118 is biased so that it would normally conduct if provided an emitter current. However, when the base of transistor 118 is pulled down, transistor 120 is allowed to conduct, and transistor 118 will not conduct as a consequence of the common emitter connection. Assuming an $A_0'$ input, current will then be supplied to the $A_1$ terminal of matrix 104 rather than the $A_0$ terminal bringing into effect the appropriate result of the carry upon matrix 104. If the A input to the second matrix, as applied at terminals $A_0'$ through $A_9'$ were any other value, it would be increased by one as a result of the carry, thereby causing the correct second column digit output to be provided at leads $C_0$ through $C_{18}$ of matrix 104.

Transistors of bank 116 as well as those of matrices 102 and 104 are advantageously accommodated upon the same integrated circuit structure if desired. The whole circuit comprises almost entirely semiconductor elements. Diodes 106 and 108, which may comprise diode connected transistors, may also be accommodated on the same structure.

While the matrix according to the present invention has been particularly described as an adder, it will be appreciated that other desired appropriate output codings may be employed. In either case, combinations of input for which a desired output is to be produced are applied to transistors in the matrix which share a common collector in the same isolation region, thereby greatly simplifying the integrated circuit construction.

I claim:

1. An adding matrix comprising:

a plurality of transistors each having a collector portion, a base portion, and an emitter portion, and input terminals separately connected to said emitter portions and base portions respectively, each transistor providing a collector output when both input terminals thereof receive a predetermined input, means interconnecting the emitter input terminals of said transistors in first groups corresponding respectively to first input values, means interconnecting the base input terminals of said transistors in second groups corresponding respectively to second input values, wherein each transistor is identified by a unique combination of input connections with respect to said first and second groups, ones of said transistors having common collector output means as the combined input values thereof add to the same sum, and means for providing an input to only a selected first group interconnecting means and a selected second group interconnecting means.

2. The matrix according to claim 1 wherein said common collector output means comprise common collector output connections joining selected collector portions.

3. The matrix according to claim 1 wherein said common collector output means comprise adjacent collector regions in a semiconductor layer of a monolithic integrated circuit structure, said collector regions being provided by adjacent isolation regions in said semiconductor layer, ones of said base portions being disposed along said isolation regions to provide one or more transistors along each such isolation region according to the number of input combinations which result in the same sum, with each base portion separating an emitter portion from the corresponding collector region.

4. The matrix according to claim 3 wherein said means interconnecting the input terminals in first groups comprises first conductors insulatably crossing said isolation regions and making connection only with emitter input terminals of transistors in the corresponding groups, wherein such first conductor connects emitter input terminals of not more than one transistor per isolation region.

5. The matrix according to claim 4 wherein said means for interconnecting base terminals of said transistors in second groups comprise second conductors disposed in between said first conductors, in substantially the same plane therewith, connecting a base input terminal disposed in one isolation region with a base terminal in the next adjacent isolation region of a transistor the base of which is interconnected in a different first group by a different first conductor, at least ones of said base portions being provided with a pair of base terminals on each side of an emitter portion and to which said second conductors are connected in order that said second conductors may be located in between first conductors without crossing first conductors.

6. The matrix according to claim 5 wherein said first and second conductors are separated from said semiconductor layer by a layer of oxide insulation having apertures through which said conductors make connection with said emitter portions and said base portions, to form input terminals therefor.

7. The matrix according to claim 1 further including a second and substantially similar matrix also having means interconnecting the emitter input terminals thereof in first groups as well as means interconnecting the base input terminals thereof in second groups to provide another column of addition, ones of said groups of the second matrix receiving the outputs of said common collector output means of the first matrix for indicating a carry digit input to said second matrix.

8. The apparatus according to claim 7 including means for receiving indication of the carry digit to shift inputs to the second matrix by one digit position.

9. A transistor matrix comprising:

a plurality of transistors each having a collector portion, a base portion, and an emitter portion, and input terminals separately connected to said emitter portions and base portions respectively, each transistor providing a collector output when both input terminals thereof receive a predetermined input, means interconnecting the emitter input terminals of said transistors in first groups corresponding respectively to first input values, means interconnecting the base input terminals of said transistors in second groups corresponding respectively to second input values, wherein each transistor is identified by a unique combination of input connections with respect to said first and second groups, ones of said transistors having common collector output means to provide related coding information, and means for providing an input to only a selected first group interconnecting means and a selected second group interconnecting means.

10. The matrix according to claim 9 wherein said common collector output means comprise adjacent collector regions in a semiconductor layer of a monolithic integrated circuit structure, said collector regions being provided by adjacent isolation regions in said semiconductor layer, ones of said base portions being disposed along said isolation regions to provide one or more transistors along each such isolation region, with each base portion separating an emitter portion from the corresponding collector region.

11. The matrix according to claim 10 wherein said means interconnecting the input terminals in first groups comprises first conductors insulatably crossing said isolation regions and making connection only with emitter input terminals of transistors in the corresponding groups, wherein each first conductor connects emitter input terminals of not more than one transistor per isolation region.

12. The matrix according to claim 11 wherein said means for interconnecting base terminals of said transistors in second groups comprise second conductors disposed in between said first conductors in substantially the same plane therewith, connecting a base input terminal disposed in one isolation region with a base terminal in the next adjacent isolation region of a transistor the base of which is interconnected in a different first group by a different first conductor, at least ones of said base portions being provided with a pair of base terminals on each side of an emitter portion and to which said second conductors are connected in order that said second conductors may be located in between first conductors without crossing first conductors.

13. The matrix according to claim 12 wherein said first and second conductors are separated from said semiconductor layer by a layer of oxide insulation having apertures through which said conductors make connection with said emitter portions and said base portions to form input terminals therefor.